United States Patent [19]
Gochi

[11] Patent Number: 5,577,195
[45] Date of Patent: Nov. 19, 1996

[54] SEMICONDUCTOR DATA STORAGE DEVICE WITH MEANS FOR PROTECTING DATA UPON EXTERNAL POWER SUPPLY CONNECTION AND DISCONNECTION

[75] Inventor: Hidenobu Gochi, Itami, Japan

[73] Assignee: Mitsubishi Denki Kabushiki Kaisha, Tokyo, Japan

[21] Appl. No.: 115,704

[22] Filed: Sep. 3, 1993

[30] Foreign Application Priority Data

Sep. 7, 1992 [JP] Japan ................... 4-238421

[51] Int. Cl.$^6$ .................................................. G06F 11/30
[52] U.S. Cl. ........................................... 395/182.20
[58] Field of Search .................. 349/182.20, 182.21, 349/182.22, 183.18, 184.01; 365/228, 229

[56] References Cited

U.S. PATENT DOCUMENTS

| | | | |
|---|---|---|---|
| 4,065,676 | 12/1977 | Elias | 307/66 |
| 4,143,283 | 3/1979 | Graf et al. | 307/66 |
| 4,424,574 | 1/1984 | Enoki et al. | 364/900 |
| 4,482,985 | 11/1984 | Itoh et al. | 365/226 |
| 4,528,459 | 7/1985 | Wiegel | 307/66 |
| 4,691,123 | 9/1987 | Hashimoto | 307/296 R |
| 4,823,323 | 4/1989 | Higuchi | 365/228 |
| 5,237,699 | 8/1993 | Little et al. | 395/750 |
| 5,258,950 | 11/1993 | Murashima | 365/189.05 |
| 5,300,765 | 4/1994 | Mizuta | 235/492 |

FOREIGN PATENT DOCUMENTS

| | | |
|---|---|---|
| 3625179 | 5/1987 | Germany . |
| 2-54494 | 2/1990 | Japan . |
| 2-112086 | 4/1990 | Japan . |
| 3-205690 | 9/1991 | Japan . |

*Primary Examiner*—Hoa T. Nguyen
*Attorney, Agent, or Firm*—Leydig, Voit & Mayer

[57] ABSTRACT

A semiconductor data storage device includes both volatile and non-volatile semiconductor data storage elements and prevents erroneous writing of data and contention of data at the time of connection and disconnection of an external power source. When the external power source is connected to or disconnected from the semiconductor data storage device in accordance with a reset signal of a power control circuit detecting a voltage, a card enable signal line, an output enable signal line, and a write enable signal line are forcibly deactivated for a predetermined period of time by a delay circuit and gate circuits.

8 Claims, 8 Drawing Sheets

SEMICONDUCTOR DATA STORAGE DEVICE WITH MEANS FOR PROTECTING DATA UPON EXTERNAL POWER SUPPLY CONNECTION AND DISCONNECTION

BACKGROUND OF THE INVENTION

1. Field of the Invention

This invention relates to a semiconductor data storage device including both non-volatile and volatile semiconductor storage elements.

2. Description of the Related Art

FIG. 7 is a circuit diagram showing a memory card which constitutes an example of a conventional semiconductor storage device of this type. This card is detachably connected to an external device such as a reader/writer (not shown) and supplied with electrical power and various control signals from the external device, and writing and reading of data is performed in accordance with these signals. When the card is not connected to the external device, data is retained in the card by a back-up internal power source for memory backup that is provided in the card. In the drawing, numeral 1 indicates a power control circuit; numeral 2 indicates an address decoder; numeral 3 indicates an address buffer; numerals 4a and 4b indicate non-volatile semiconductor storage elements; numerals 5a and 5b indicate volatile semiconductor storage elements; numerals 6a, 6b, 7a, 7b, 8 and 9 indicate tri-state buffers; numeral 10 indicates an external power line; numeral 11 indicates a grounding line; numerals 12a and 12b indicate high-order address signal lines (AO, A1); numeral 13 indicates a card enable signal line ($\overline{CE}$); numeral 14 indicates an address bus (ADD); numeral 15 indicates an output enable signal line ($\overline{OE}$); numeral 16 indicates a write enable signal line ($\overline{WE}$); numeral 17 indicates an internal signal line; numeral 18 indicates a reset signal line (RST); numeral 19 indicates an internal address bus; numeral 20 indicates a data bus (DATA); numerals 21a, 21b, 22a and 22b indicate memory chip enable signal lines ($\overline{MCE}$); numeral 23 indicates a memory output enable signal line ($\overline{MOE}$); numeral 24 indicates a memory write enable signal line ($\overline{MWE}$); numerals 25a, 25b, 26a, 26b, 27 and 28 indicate pull-up resistors; and numeral 29 indicates an internal power source. In the following description, signal lines and signals transmitted therethrough are referred to by the same reference numerals. The circuit shown is a negative logic circuit.

The power control circuit 1 detects the voltage of the external power line 10 to connect either the external power line 10 or the internal power source 29 to the internal power line 17 in accordance with the voltage detected. That is, when the card can be supplied with power from the external device, the external power line 10 is connected to the internal power line 17 and, when the card cannot be supplied with power from the external power source, the internal power source 29, generally consisting of a battery contained in the card, is connected to the internal power line 17. Further, the power control circuit 1 generates a reset signal (RST), which is at "L" level when the card can be supplied with power from the external power source, and at "H" level when the card is being supplied with power from the internal power source 29. Signals on lines 12a, 12b, 13, 14, 15, and 16 for memory control signals supplied from an external device for reading and writing of data with respect to the card. Input and output of data to and from the card is effected through the data bus 20. The card enable signal on line 13 ($\overline{CE}$) makes the card ready for operation. The high-order address signal lines 12a and 12b (AO and A1) set addresses in the storage area of the card. In accordance with the high-order address signals on lines 12a and 12b, a predetermined storage element is made ready for operation and, by an address signal on line 14 (ADD), an address in the storage element is designated. The output enable signal on line 15 ($\overline{OE}$) and the write enable signal on line 16 ($\overline{WE}$) permit writing and reading of data, respectively. The address decoder 2 is made ready for operation by the card enable signal on line 13 ($\overline{CE}$) at "L" level, and sets one of the memory chip enable signals on lines 21a, 21b, 22a and 22b ($\overline{MCE}$) to "L" level in accordance with the high-order address signals on lines 12a and 12b (AO and A1). The memory chip enable signals on lines 21a, 21b, 22a and 22b are transmitted through the tri-state buffers 6a, 6b, 7a and 7b to the storage elements 4a, 4b, 5a and 5b, respectively, and the storage element which receives the "L" level memory chip enable signal is activated.

The address bus buffer 3 supplies the input address signal on line 14 (ADD) to each storage element as an internal address signal on line 19. The internal address signal on line 19 sets a data address in the storage element. The output enable signal on line 15 ($\overline{OE}$) and the write enable signal on line 16 ($\overline{WE}$) are supplied through the tri-state buffers 8 and 9, respectively, to the storage elements as a memory output enable signal on line 23 ($\overline{MOE}$) and a memory write enable signal on line 24 ($\overline{MWE}$). The reset signal on line 18 (RST) is input to the control terminal of each of the tri-state buffers 6a, 6b, 7a, 7b, 8 and 9. When the reset signal on line 18 (RST) is at "L" level, the input signal is output as it is, and, when the reset signal is at "H" level, the output line is brought to a high-impedance state ("Hz"). To determine the level of the signal lines in the high-impedance state, the pull-up resistors 25a, 25b, 26a, 26b, 27 and 28, which are connected to the external power line 10 or the internal power line 17, are respectively connected to the memory chip enable signal lines 21a, 21b, 22a and 22b, the memory output enable signal line 23 and the memory write enable signal line 24. The external power line 10 having no backup is indicated by a circle whereas the internal power line 17 with backup is indicated by a square. The non-volatile semiconductor storage elements 4a and 4b and the address bus buffer 3 are connected to the external power line 10, whereas the volatile semiconductor storage elements 5a and 5b and the address decoder 2 are connected to the internal power line 17 with backup.

Next, the operation of this IC memory card will be described. When the IC memory card is connected to the external device (not shown) and voltage is supplied to the external power line 10 from the external power source, the voltage control circuit 1 switches the power source from the internal power source 29 to the external power line 10. At this time, the reset signal on line 18 (RST) changes from "H" to "L" level, whereby each of the tri-state buffers 6a, 6b, 7a, 7b, 8 and 9 is activated. In this condition, the semiconductor storage elements 4a, 4b, 5a and 5b can be selectively accessed for writing or reading of data through control of the card enable signal on line 13, the address signal on line 14, the high-order address signal on lines on line 12a and 12b, output enable signal on line 15 and the write enable signal on line 16. The address decoder 2 sets a predetermined one of its four output terminals ($\overline{Y0}$), ($\overline{Y1}$), ($\overline{Y2}$) and ($\overline{Y3}$) to "L" level in accordance with the 2-bit high-order address signals on line 12a and 12b. The storage element receiving the "L" level memory chip enable signal ($\overline{MCE}$) is activated. Input and output of data to and from each storage element is effected through the data bus 20, and data is written to an address designated by the internal address signal on line 19 or read from the address.

When the IC memory card is detached from the external device and the power supply from the external power source is stopped, the power control circuit 1 switches the power source to the internal power source 29. At this time, the reset signal on line 18 (RST) changes from "L" to "H" level, whereby the output lines of the tri-state buffers 6a, 6b, 7a, 7b, 8 and 9 are all brought to a high-impedance state ("Hz"). The memory chip enable signal lines 22a and 22b and the memory write enable signal line 24 are connected to the internal power line 17 having backup through the pull-up resistors 26a, 26b and 28, so that they are maintained at "H" level, whereby the volatile semiconductor storage elements 5a and 5b are kept in a condition in which it is impossible to perform writing or reading, data being retained by the power from the internal power source 29 connected to the internal power line 17. The non-volatile semiconductor storage devices 4a and 4b need no data backup. To further reduce the power consumption when the card is not being used, the memory chip enable signal lines 21a and 21b are connected to the external power line 10 having no power backup through the pull-up resistors 25a and 25b. The memory output enable signal line 23 is also connected to the external power line 10 having no backup through the pull-up resistor 27.

In the conventional semiconductor storage device, constructed as described above, the level of each control signal line when connecting and disconnecting the external power source is controlled by a pull-up resistor, so that the level of each signal line does not change rapidly. Therefore, when the external power source is suddenly switched off during, for example, data writing, it takes a long time for the memory chip enable signal lines and the memory write enable signal line of the volatile semiconductor storage elements to reach "H" level, resulting in erroneous writing, etc.

This will be explained with reference to FIG. 8. Assuming that the external power source is switched off at time T1 during writing of data, the power source voltage Vcc starts to fall. When the power control circuit 1 detects at time T2 that the power source voltage Vcc has become lower than a predetermined value, the reset signal changes from "L" to "H" level, whereby the output side of each tri-state buffer is brought to a high-impedance state ("Hz"), and the memory chip enable signal lines 21a and 21b ($\overline{\text{MCE}}$) and the memory output enable signal line 23 ($\overline{\text{MOE}}$), connected to the external power line 10 without backup, are gradually brought to "L" level. In contrast, the memory chip enable signal lines 22a and 22b ($\overline{\text{MCE}}$) and the memory write enable signal line 24 ($\overline{\text{MWE}}$), connected to the internal power line 17 having backup, are gradually brought to "H" level. The memory chip enable signal lines 22a and 22b ($\overline{\text{MCE}}$) and the memory write enable signal line 24 ($\overline{\text{MWE}}$) for the volatile semiconductor storage elements 5a and 5b are at "L" level during writing. When the external power line is switched off, they rise from "L" to "H" level. This rise in level, however, does not take place quickly, so that erroneous writing may occur before "H" level is attained.

Immediately after the connection of the external power source to the IC memory card, the memory chip enable signal lines 21a and 21b ($\overline{\text{MCE}}$) and the memory output enable signal line 23 ($\overline{\text{MOE}}$) for the non-volatile semiconductor storage elements change from "L" to "H" level, so that the two non-volatile semiconductor storage elements 4a and 4b may be simultaneously ready for operation, resulting in contention of data in the data bus 20, etc.

SUMMARY OF THE INVENTION

This invention has been made with a view toward eliminating the above problem in the prior art. It is accordingly an object of the present invention to provide a semiconductor data storage device in which no erroneous writing of data or contention of data occurs at the time of connection or disconnection of the external power source.

In order to achieve the above object, the present invention provides a semiconductor data storage device which is detachably connectable to an external device and supplied with power from an external power source, data into being written and read from the semiconductor storage device in accordance with various control signal on lines on line from the external device, the semiconductor data storage device comprising: storage means including non-volatile semiconductor data storage elements and volatile semiconductor data storage elements; a data bus through which data is input and output from the storage means; control means including the various control signal on lines on line for controlling writing data into and reading data from the storage means; address means for address setting of the storage means; an internal power source for data backup; power control means which detects power voltage and switches between the external power source and the internal power source such that when the external device is connected to the semiconductor data storage device, power is supplied from the external power source and when the external device is disconnected from the semiconductor data storage device, power is supplied from the internal power source, and which generates a reset signal on line indicating which power source is connected; means for bringing the various control signal on lines on line to a high-impedance state when the external power source is disconnected in accordance with the reset signal on line; a group of pull-up resistors for determining the levels of the various control signal on lines on line when they are in the high-impedance state; and forced control means for forcibly deactivating all the various control signal on lines on line for a predetermined period of time when the external power source is connected/disconnected in accordance with the reset signal of the power control means, wherein erroneous writing when the external power source is disconnected during data writing, and contention of data in the data bus when the above external power source is connected are prevented.

In a first embodiment of this invention, the control means for controlling writing and reading of data include: a card enable signal line for activating the semiconductor storage device; output enable and write enable signal line for respectively controlling reading and writing of data; and an address decoder which is activated by the card enable signal on line and generates memory chip enable signal on lines on line for activating the storage means in accordance with the address of the address means and which generates, when in an inactive state, memory chip enable signals on line for deactivating the storage means, wherein the means for bringing the various control signal on lines on line to the high-impedance state in accordance with the reset signal on line consist of tri-state buffers which are respectively provided with respect to the output enable and write enable signal on lines on line and the memory chip enable signal on lines on line and whose output is in the high-impedance state when in the inactive state, and wherein the forced control means for forcibly deactivating the various control signal on lines on line comprise: a delay circuit which, when the external power source is disconnected, forcibly deactivates the chip enable signals, output enable and write enable signal on lines on line in accordance with the reset signal and deactivates the tri-state buffers so that an output in a high-impedance state may be obtained after the elapse of a predetermined period of time long enough for each of the various control signals on line to be retained at a predetermined value by the group of pull-up resistors, and which, when the external power source is connected, activates the tri-state buffers in accordance with the reset signal, and receives the card enable, output enable and write enable signals after the elapse of a predetermined period of time long enough for these signals to completely attain a predetermined value, delaying the reset signal by a predetermined time; a group of OR gates receiving the reset signal and the output of the delay circuit, forcibly deactivating the card enable signal, output enable and write enable signals when the external power source is disconnected and delaying the input of these signals when the external power source is connected; and an AND gate which receives the reset signal and the output of the delay circuit, and which delays the deactivation of the tri-state buffers for the output enable signal, write enable signal and memory chip enable signals when the external power source is disconnected, activating the tri-state buffers when the external power source is connected.

In a second embodiment of this invention, the control means for controlling writing and reading of data include: a card enable signal line for activating the data semiconductor data storage device; output enable and write enable signal lines for respectively controlling reading and writing of data; and an address decoder which is activated by the card enable signal and generates memory chip enable signals for activating the storage means in accordance with the address of the address means and which generates, when in an inactive state, memory chip enable signals for deactivating the storage means, wherein the means for bringing the various control signals to the high-impedance state in accordance with the reset signal consist of tri-state buffers which are respectively provided with respect to the output enable and write enable signals on line and the memory chip enable signals and whose output is in the high-impedance state when in the inactive state, and wherein the forced control means for forcibly deactivating the various control signals comprises an edge pulse generator for generating pulses at an interval corresponding to the predetermined period of time in response to rise and fall of the reset signal, and inactive signal generating circuits which connect the output enable signals, write enable signals and memory chip enable signals to the internal power source so as to deactivate them for the predetermined period of time in accordance with the pulse generated by the edge pulse generator, the predetermined period of time being long enough for each of the various control signals to be retained at a predetermined value by the group of pull-up resistors when the external power source is disconnected, and long enough for the card enable, output enable and write enable signals to completely attain a predetermined value when the external power source is connected.

In the semiconductor data storage device of this invention, all the control signals for the data storage elements are forcibly deactivated for a predetermined period of time when the external power source is connected or disconnected, and then their levels are fixed by the pull-up resistors, whereby erroneous writing, and contention of data caused by a delay in change of the control signals due to the pull-up resistors, can be prevented.

DESCRIPTION OF THE PREFERRED EMBODIMENTS

[Embodiment 1]

Figure 1:
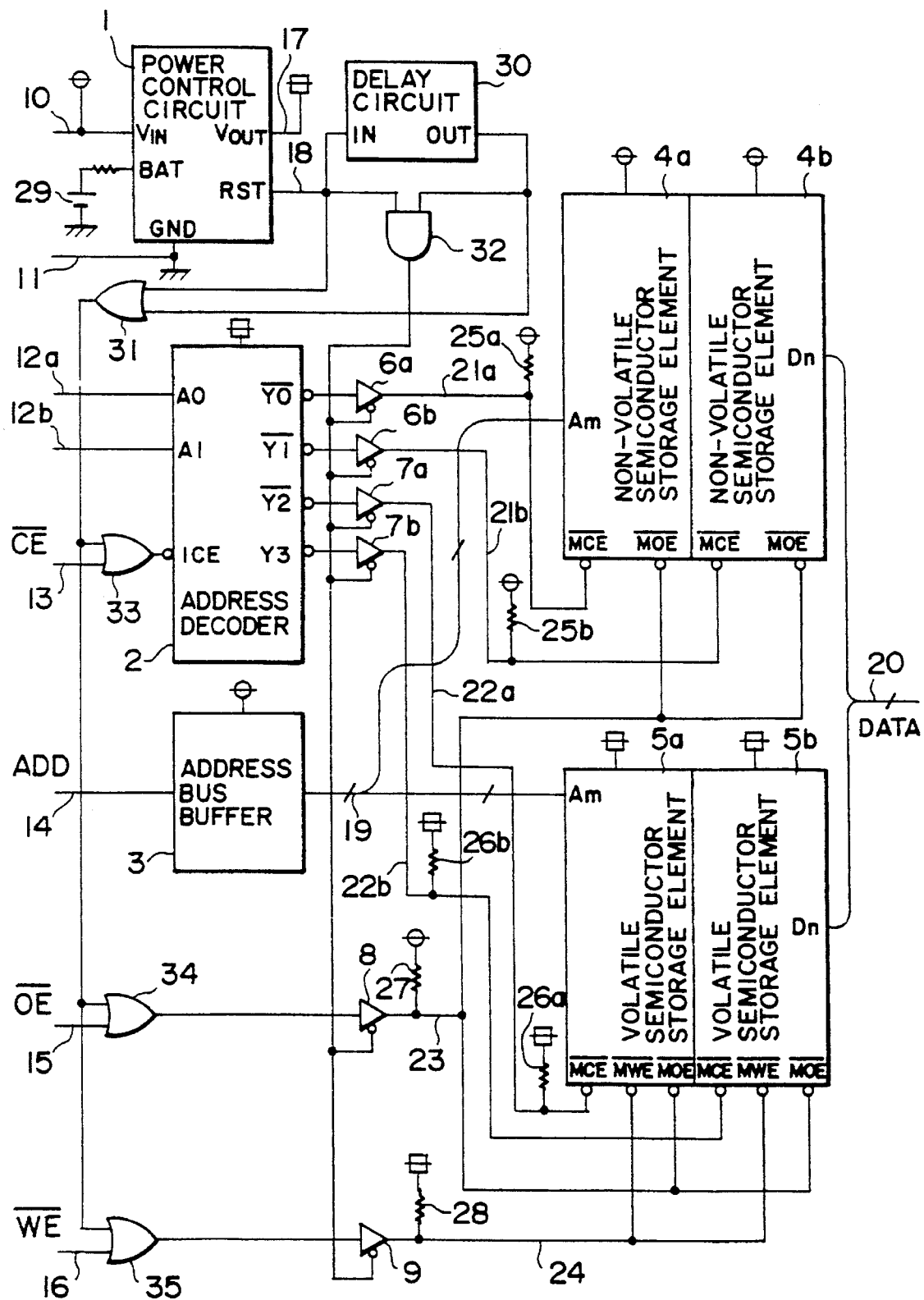
FIG. 1 is a circuit diagram of a semiconductor data storage device according to an embodiment of this invention.
Figure 7:
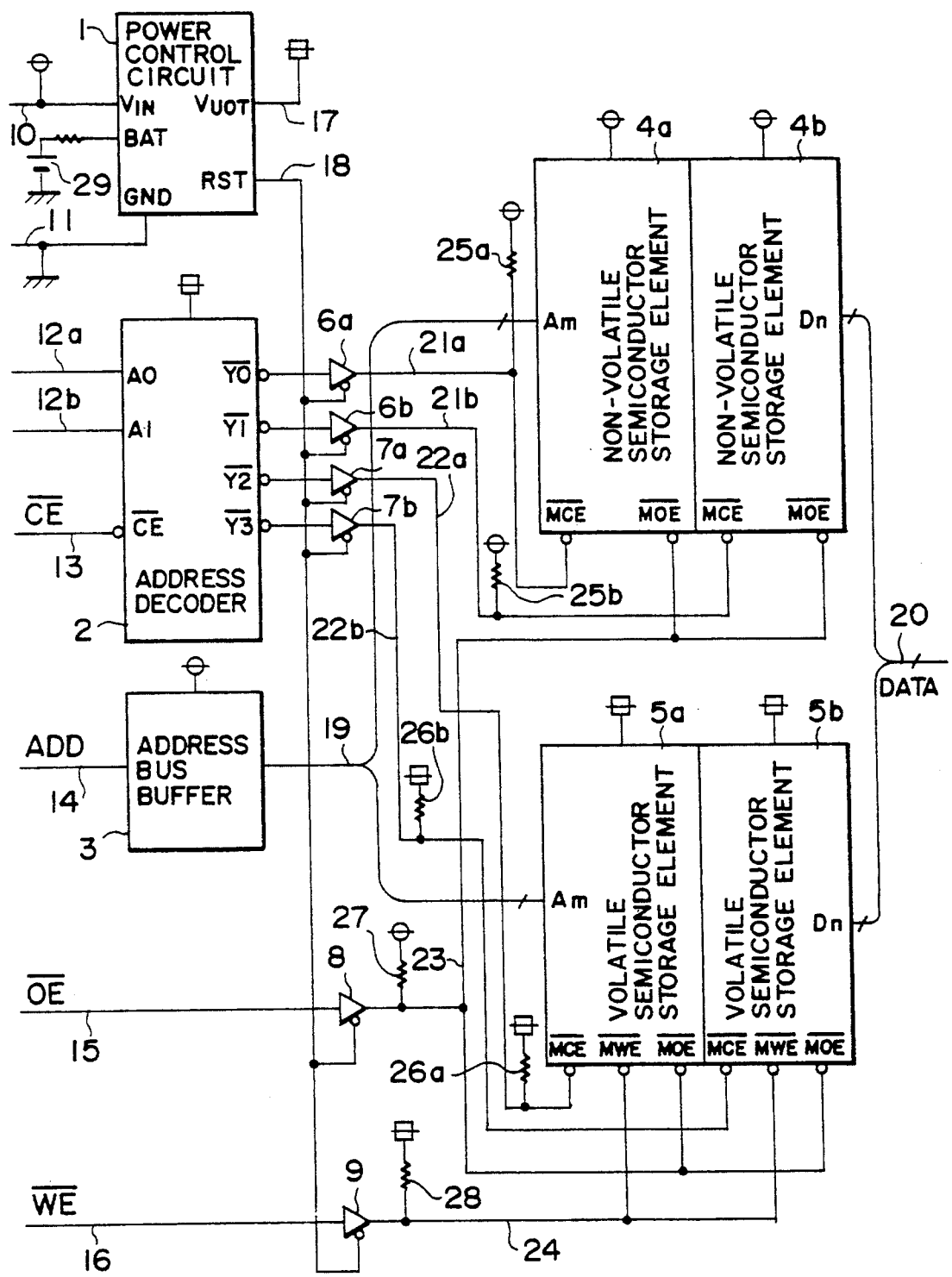
FIG. 7 is a circuit diagram of a conventional semiconductor data storage device.
Figure 8:
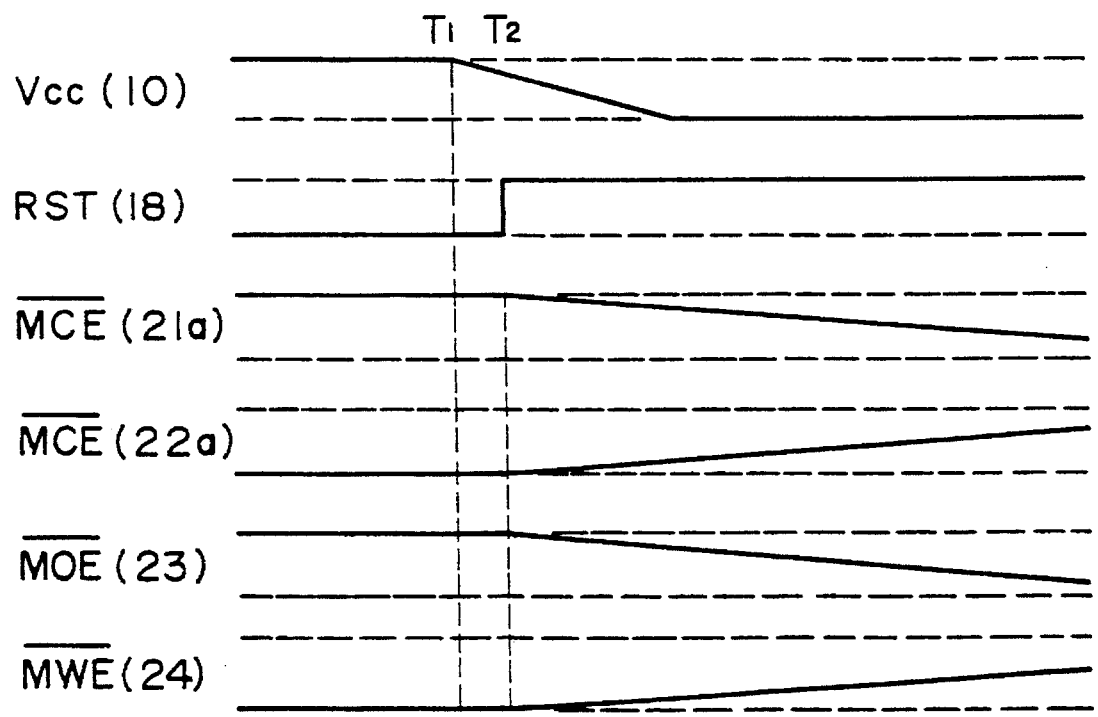
FIG. 8 is a timing chart showing the states of the signals in the semiconductor data storage device of FIG. 7 when the associated external power source is disconnected therefrom.

FIG. 1 is a circuit diagram of an IC memory card according to an embodiment of this invention. The components which are the same as or equivalent to those of the above-described conventional card are indicated by the same reference numerals, and a description of such components will be omitted. Numeral 30 indicates a delay circuit; numeral 31 indicates a first reset signal control circuit; numeral 32 indicates a second reset signal control circuit; numeral 33 indicates a card enable signal control circuit; numeral 34 indicates an output enable signal control circuit; and numeral 35 indicates a write enable signal control circuit. These circuits are part of the forced control means for forcibly deactivating all the control signals for a predetermined period of time when the external power source is connected or disconnected. The delay circuit 30 is a circuit which outputs the reset signal on line 18 from the power control circuit 1 after delaying its change by a predetermined time. The second reset signal control circuit 32 includes an AND gate, and the other control circuits 31, 33, 34 and 35 include OR gates. The reset signal on line 18 and the output signal of the delay circuit 30 are input to the first and second reset signal control circuits 31 and 32, respectively. The control circuits 33, 34 and 35 are circuits for gating the card enable signal line 13 ($\overline{CE}$), the output enable signal line 15 ($\overline{OE}$), and the write enable signal line 16 ($\overline{WE}$), respectively, in accordance with the output signal of the first reset signal control circuit 31. Connected to one of the input terminals of each of these control circuits is a control signal for the circuit, and connected to the other input terminal of the same is the output signal of the first reset signal control circuit 31. The output signal of the second reset signal control circuit 32 is connected to the control terminal of each of the tri-state buffer circuits 6a, 6b, 7a, 7b, 8 and 9. A signal input from the control circuit 33 to the address decoder 2 is called an inner card enable signal ($\overline{ICE}$), in contrast with the card enable signal ($\overline{CE}$), which is input to the card enable signal control circuit 33. The other components of this IC memory card are the same as those of the conventional one shown in FIG. 7.

The storage means includes the non-volatile semiconductor data storage elements 4a and 4b and the volatile semiconductor data storage elements 5a and 5b. The data bus includes the data bus 20. The control signal means, sometimes referred to here as read/write and activation signal means the address decoder 2, the card enable signal line 13, the output enable signal line 15, the write enable signal line 16, the memory chip enable signal lines 21a, 21b, 22a and 22b, the memory output enable signal line 23, and the memory write enable signal line 24. The address means includes the address bus buffer 3, the address bus 14, the internal address bus 19, and the high-order address signal lines 12a and 12b. The internal power source includes the internal power source 29. The power control means comprises the power control circuit 1, the external power line 10, the grounding line 11, the internal power line 17, and the reset signal line 18. The means for bringing the control signals to the high-impedance state comprises the tri-state buffers 6a, 6b, 7a, 7b, 8 and 9. The pull-up resistors for determining the level of the control signals in the high-impedance state include the pull-up resistors 25a, 25b, 26a, 26b, 27 and 28. The forced control means includes the delay circuit 30, the first reset signal control circuit 31, the second reset signal control circuit 32, the card enable signal control circuit 33, the output enable signal control circuit 34, and the write enable signal control circuit 35.

Figure 2:
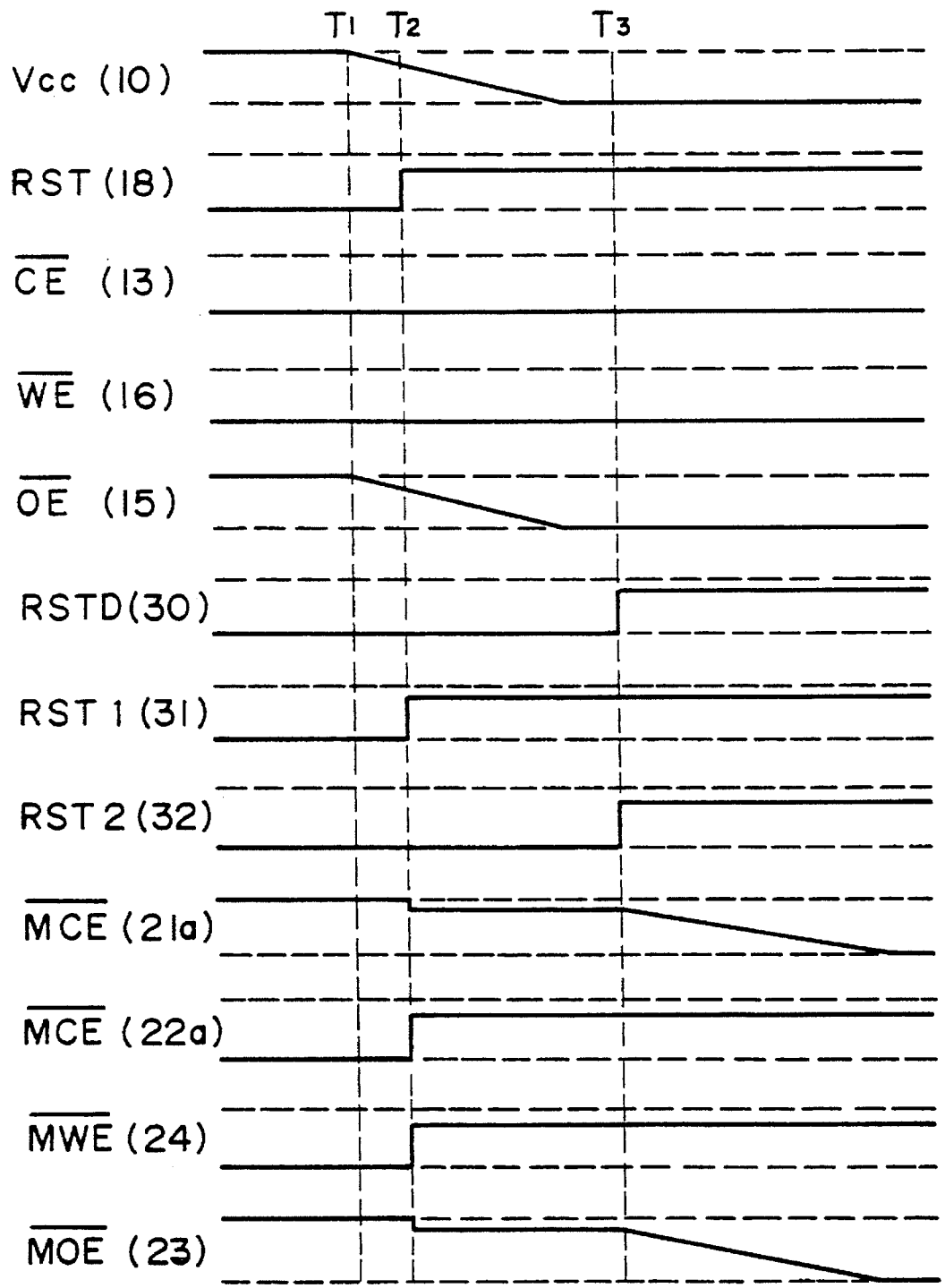
FIG. 2 is a timing chart showing the states of the signals in the semiconductor data storage device of FIG. 1 when the associated external power source is disconnected therefrom.

Next, the operation of this IC memory card will be described. FIG. 2 is a time chart of the signals in the memory card when the external power source is switched off while data is being written, for example, to the volatile semiconductor data storage element 5a. When the external power source is switched off at time T1, the power voltage Vcc of the external power line 10 starts to fall. When the power control circuit 1 detects at time T2 that the power voltage Vcc has become lower than a predetermined level, the reset signal rises from "L" to "H" level. At this time, the output signal (RES1) of the first reset signal control circuit 31 also rises, all the output signals of the control circuits 33, 34 and 35 attaining "H" level. When the inner card enable signal ($\overline{ICE}$) is at "H" level and inactive, the output terminals $\overline{Y0}$), ($\overline{Y1}$), ($\overline{Y2}$) and ($\overline{Y3}$) of the address decoder 2 are all at "H" level. At this point in time, the output signal (RSTD) of the second reset signal control circuit 32 is still at "L" level, so that the tri-state buffers 6a, 6b, 7a, 7b, 8 and 9 are all active (conducting). Therefore, the memory chip enable signal lines 21a, 21b, 22a and 22b ($\overline{MCE}$), the memory output enable signal line 23 ($\overline{MOE}$), and the memory write enable signal line 24 ($\overline{MWE}$), which are memory control signals, are all raised to "H" level simultaneously with the rise from "L" to "H" level of the reset signal 18 (RST), and all the data storage elements 4a, 4b, 5a and 5b become inactive. Therefore, erroneous writing as in the prior art does not occur. In FIG. 2, the "H" level of each signal is slightly lowered for the reason that the voltage of the internal power source for data backup is somewhat lower than the voltage of the external power source. This also applies to the cases described below.

After the elapse of a predetermined period of time, the output signal (RSTD) of the delay circuit 30 attains "H" level at time T3, causing the output signal (RST2) of the second reset signal control circuit 32 to reach "H" level, with the result that all the output lines of the tri-state buffers 6a, 6b, 7a, 7b, 8 and 9 are brought to the high-impedance state ("Hz"). However, the memory chip enable signal lines 22a and 22b ($\overline{MCE}$) and the memory write enable signal line 24 ($\overline{MWE}$) for the volatile semiconductor data storage elements 5a and 5b are already at "H" level, and are retained at "H" level afterwards by the pull-up up resistors 26a, 26b and 28, respectively. The memory chip enable signal line 21a and 21b ($\overline{MCE}$) and the memory output enable signal line 23 ($\overline{MOE}$) for the non-volatile semiconductor storage elements 4a and 4b, connected to the external power line 10 having no backup through the pull-up resistors 25a, 25b and 27, respectively, are gradually lowered to "L" level after that.

Figure 3:
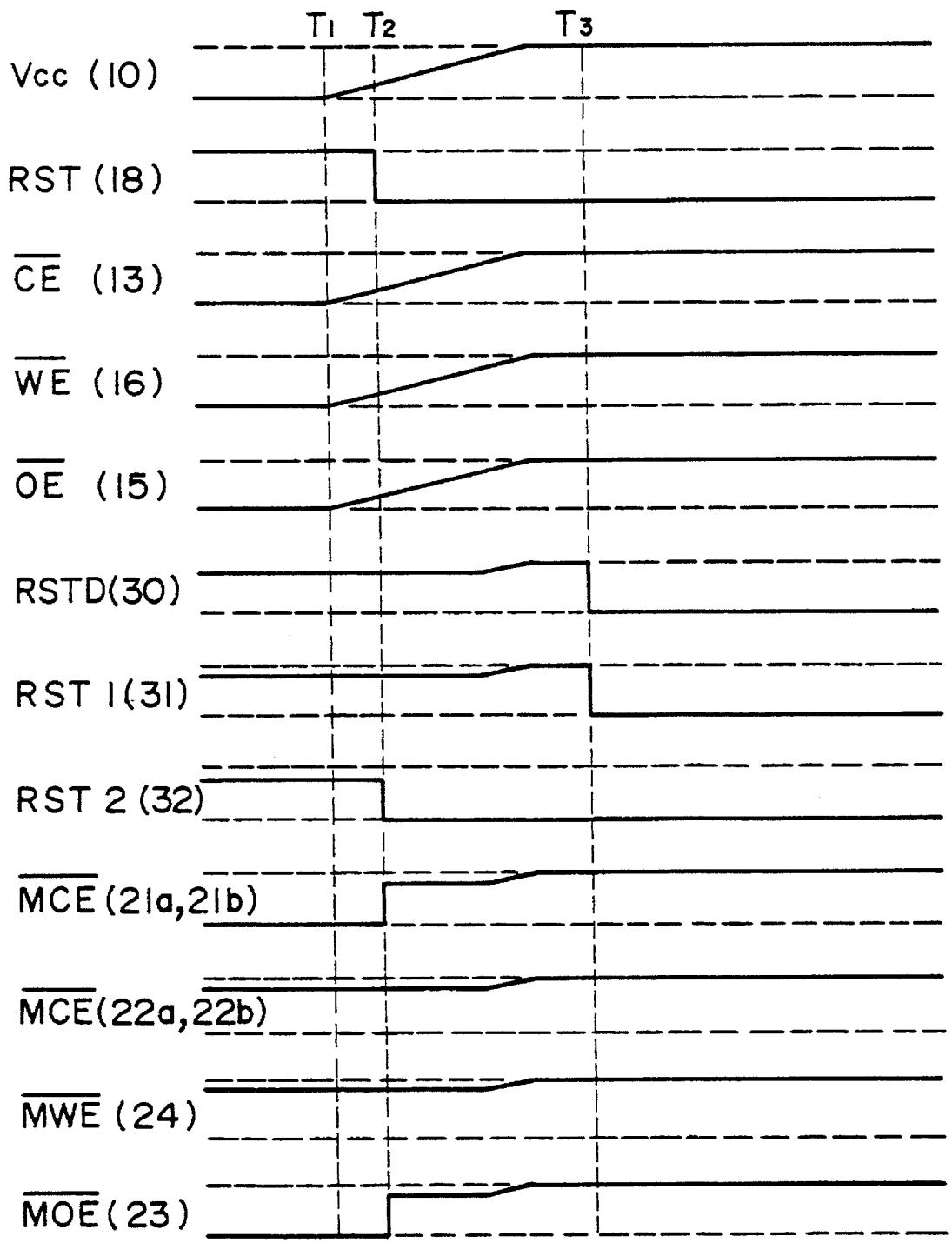
FIG. 3 is a timing chart showing the states of the signals in the semiconductor data storage device of FIG. 1 when the associated external power source is connected thereto.

Next, the operation conducted when the IC memory card is connected to the external device, and the external power source is connected to the external power line, will be described. FIG. 3 is a time chart showing the conditions of the signals in this case. When the card is connected to the external device, and the external power source is connected to the external power line 10 at, for example, time T1, the power voltage Vcc of the external power line 10 starts to rise. At the same time, in an initial stage subsequent to this connection, the card enable signal line 13 ($\overline{CE}$), the output enable signal line 15 ($\overline{OE}$) and the write enable signal line 16 ($\overline{WE}$) from the external device are raised from "L" to "H" level in order to deactivate the data storage elements. When the power control circuit 1 detects at time T2 that the power voltage Vcc has attained a level not lower than a predetermined value (which differs from the predetermined value in the case of FIG. 2), the reset signal line 18 falls from "H" to "L" level, whereby the output signal (RES2) of the second reset signal control circuit 32, which is an AND gate, also falls to "L" level, and all the tri-state buffers 6a, 6b, 7a, 7b, 8 and 9 become active (conducting). At this point in time, the output signal (RSTD) of the delay circuit 30 is still at "H" level, so that the output signal (RST1) of the first reset signal control circuit 31 is at "H" level. Therefore, the outputs of the control circuits 33, 34 and 35 are also at "H" level, and all the output terminals ($\overline{Y0}$), ($\overline{Y1}$), ($\overline{Y2}$) and ($\overline{Y3}$) of the address decoder 2 attain "H" level. As a result, the memory chip enable signal line 21a, 21b, 22a and 22b ($\overline{MCE}$), the memory output enable signal line 23 ($\overline{MOE}$), and the memory write enable signal line 24 ($\overline{MWE}$) all attain "H" level, and all the data storage elements 4a, 4b, 5a and 5b become inactive. Therefore, no contention of data occurs in the data bus 20.

When, after the elapse of a predetermined period of time, the output signal (RSTD) of the delay circuit 30 falls to "L" level at time T3, the output signal (RST1) of the first reset signal control circuit 31 falls to "L" level simultaneously with the fall, so that the control circuits 33, 34 and 35 respectively output the card enable signal ($\overline{CE}$), the output enable signal ($\overline{OE}$) and the write enable signal ($\overline{WE}$) from the external device as they are. Therefore, taking into account the time it takes for these control signals to completely rise from "L" to "H" level after the connection of the external device, it is necessary to set the delay time of the delay circuit 30 longer than that rise time. After that, writing or reading of data is performed under the control by the above various control signals and address signals.

[Embodiment 2]

Figure 4:
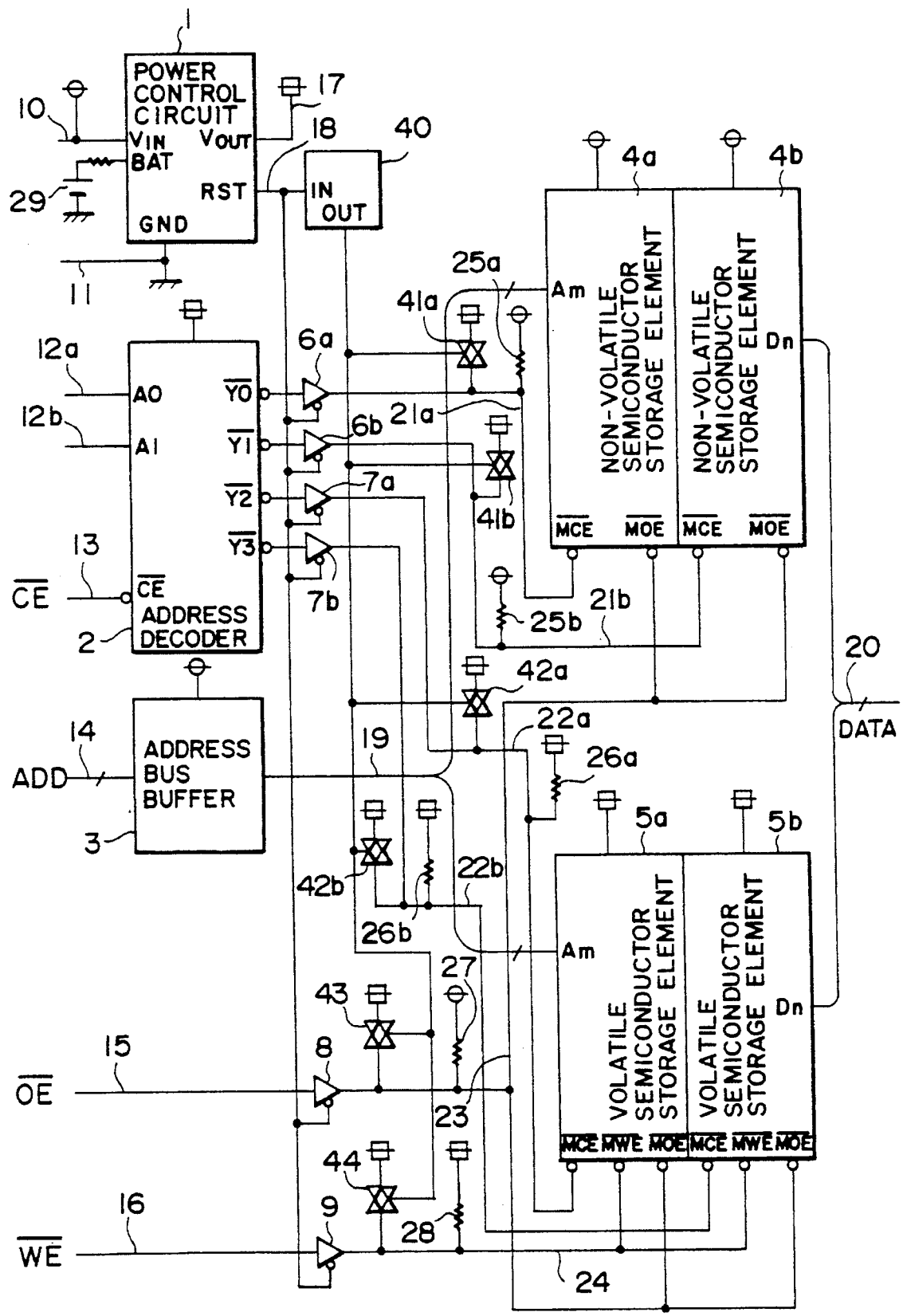
FIG. 4 is a circuit diagram of a semiconductor data storage device according to another embodiment of this invention.

FIG. 4 is a circuit diagram showing an IC memory card according to another embodiment of this invention. In the drawing, numeral 40 indicates an edge pulse generator for generating an "H"-level pulse of a predetermined length at the leading and trailing edges of the reset signal (RST). Numerals 41a, 41b, 42a, 42b, 43 and 44 indicate inactive signal generation circuits respectively provided in the memory chip enable signal lines 21a, 21b, 22a and 22b ($\overline{MCE}$), the memory output enable signal line 23 ($\overline{MOE}$), and the memory write enable signal line 24 ($\overline{MWE}$). The inactive signal generation circuits 41a, 41b, 42a, 42b, 43 and 44 are electrical switches for example, transistors, which are controlled by the output signal (RSTP) from the edge pulse generator 40 and, while this signal is at "H" level, connect the control signal lines, which are respectively connected thereto, directly to the internal power line 17 having backup so as to keep them at "H" level. The circuits 40, 41a, 41b, 42a, 42b, 43 and 44 are part of the forced control means for deactivating all the control signals for a predetermined period of time when the external power source is connected or disconnected. The other components of this embodiment are basically the same as those of the conventional example, so a description thereof will be omitted.

Figure 5:
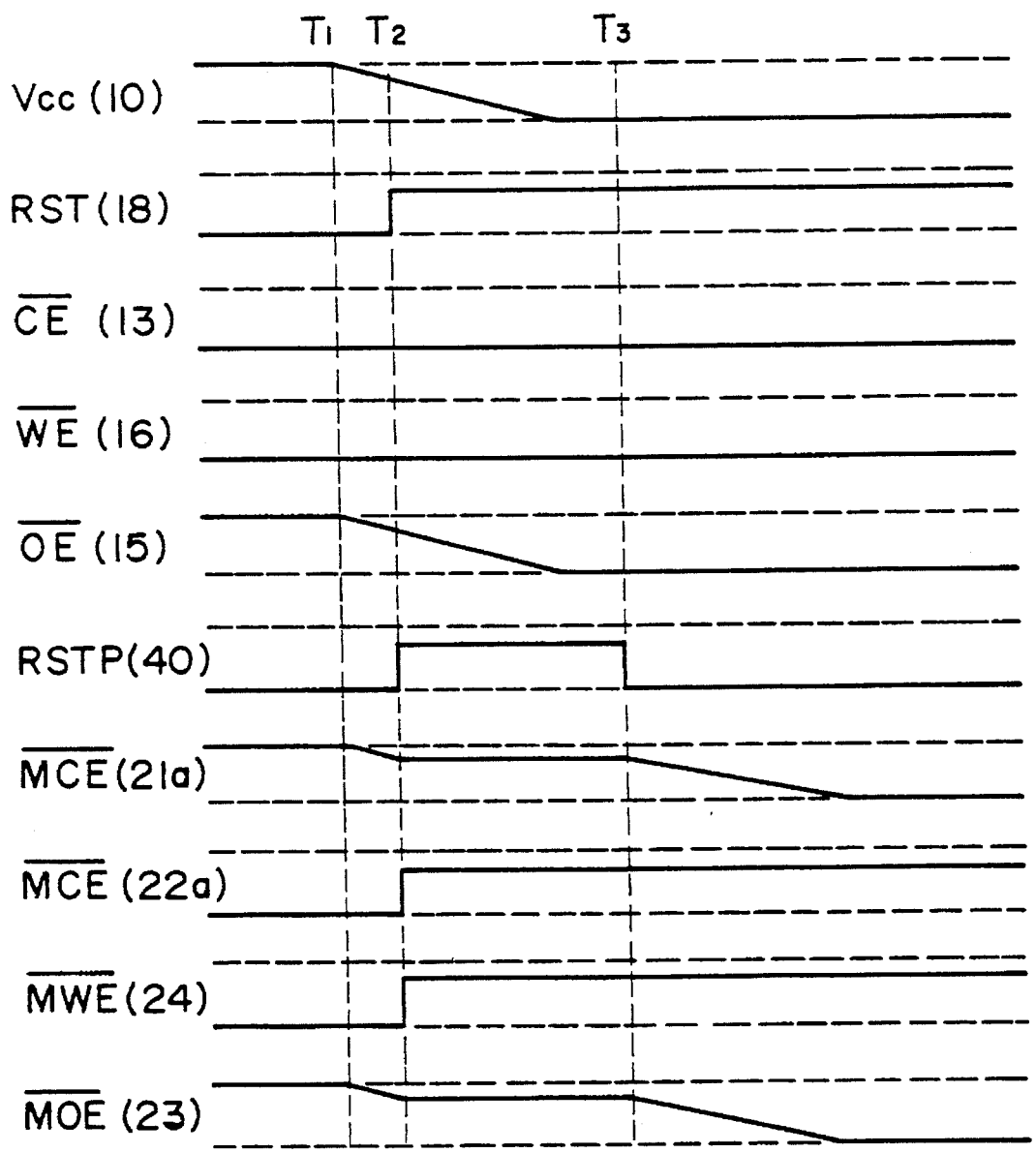
FIG. 5 is a timing chart showing the states of the signals in the semiconductor data storage device of FIG. 4 when the associated external power source is disconnected therefrom.

Next, the operation of this embodiment will be described. FIG. 5 is a time chart showing the condition of the signals when the external power source is switched off while data is being written, for example, to the non-volatile semiconductor data storage element 5a. When the external power source is switched off at time T1, the power voltage Vcc of the external power line 10 starts to fall. When, at time T2, the power control circuit 1 detects that the power voltage Vcc has become lower than a predetermined value, the reset signal 18 (RST) rises from "L" to "H" level. When the level of the reset signal (RST) has changed, the output signal (RSTP) of the edge pulse generator 40 is at "H" level for a predetermined period of time. That is, the edge pulse generator 40 generates an "H"-level pulse of a predetermined length. While the output signal (RSTP) of the edge pulse generator 40 is at "H" level, the inactive signal generation circuits 41a, 41b, 42a, 42b, 43 and 44 are in the ON state, and connect the control signal lines 21a, 21b, 22a, 22b, 23 and 24, which are respectively connected thereto, to the internal power line 17 having backup, with the result that the control signals are set to "H" level. Thus, as in the circuit of the first embodiment, the storage elements 4a, 4b, 5a and 5b are all deactivated. Therefore, erroneous writing of data as in the prior art does not occur.

When, after the elapse of a predetermined time, the output signal (RSTP) of the edge pulse generator 40 is restored to "L" level at time T3, the inactive signal generation circuits 41a, 41b, 42a, 42b, 43 and 44 are brought to the OFF state. At this point in time, the memory chip enable signal lines 22a and 22b ($\overline{\text{MCE}}$) and the memory write enable signal line 24 ($\overline{\text{MWE}}$) for the volatile semiconductor storage elements 5a and 5b are already at "H" level, so that they are kept at "H" level afterwards by the pull-up resistors 26a, 26b and 28, respectively. Further, the memory chip enable signal lines 21a and 21b ($\overline{\text{MCE}}$) and the memory output enable signal line 23 ($\overline{\text{MOE}}$) for the non-volatile semiconductor data storage elements 4a and 4b, which are connected to the external power line 10 having no backup through the pull-up resistors 25a, 25b and 27, respectively, are gradually lowered to "L" level after that.

Figure 6:
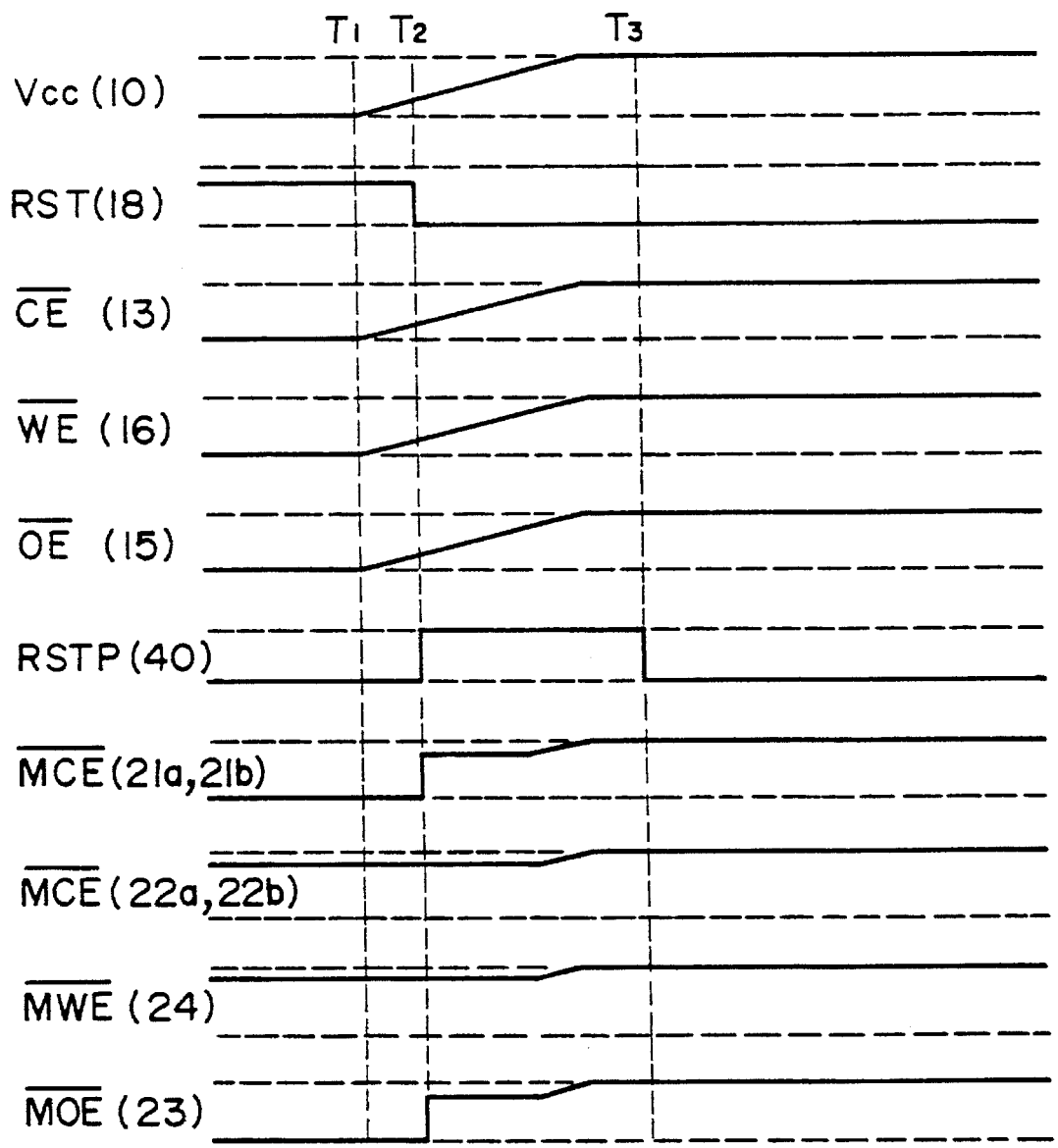
FIG. 6 is a timing chart showing the states of the signals in the semiconductor data storage device of FIG. 4 when the associated external power source is connected thereto.

Next, the operation conducted when the IC memory card is connected to the external device, and the external power source is connected to the external power line, will be described. FIG. 6 is a time chart showing the conditions of the signals in this case. When the card is connected to the external device, and the external power source is connected to the external power line 10 at, for example, time T1, the power voltage Vcc of the external power line 10 starts to rise. At the same time, in an initial stage subsequent to the connection, the card enable signal line 13 ($\overline{\text{CE}}$) the output enable signal line 15 ($\overline{\text{OE}}$) and the write enable signal line 16 ($\overline{\text{WE}}$) from the external device are raised from "L" to "H" level in order to deactivate the data storage elements. When the power control circuit 1 detects at time T2 that the power voltage Vcc has attained a level not lower than a predetermined value (which differs from the predetermined value in the case of FIG. 5), the reset signal falls from "H" to "L" level. As a result of the change in the reset signal the edge pulse generator 40 generates an "H"-level pulse of a predetermined length as the output signal (RSTP). While the output signal (RSTP) of the edge pulse generator 40 is at "H" level, the inactive signal generation circuits 41a, 41b, 42a, 42b, 43 and 44 are in the ON state, and set the control signal lines 21a, 21b, 22a, 22b, 23 and 24, which are respectively connected thereto, to "H" level. Thus, as in the above-described case where the external power source is switched off, the storage elements 4a, 4b, 5a and 5b are all deactivated. Therefore, contention of data in the data bus 20 does not occur.

When, after the elapse of a predetermined time, the output signal (RSTP) of the edge pulse generator 40 is restored to "L" level at time T3, the inactive signal generation circuits 41a, 41b, 42a, 42b, 43 and 44 are all brought to the OFF state. After that, writing or reading of data is conducted under the control by the various control signals and address signals. Therefore, taking into account the time it takes for these control signals to completely rise from "L" to "H" level after the connection of the external device, it is necessary to set the pulse width of the output signal (RSTP) of the edge pulse generator 40 longer than that rise time.

As described above, in accordance with this invention, the various control signals are forcibly deactivated for a predetermined period of time at the time of connection/disconnection of the external power source, whereby a semiconductor data storage device can be provided in which device breakdown due to erroneous writing when the external power source is disconnected during writing and contention of data when the external power source is connected is prevented. Further, in this invention, means for forcibly deactivating the control signals are provided in the semiconductor data storage device, whereby there is no need to modify the construction, of the external device, which consists of a reader/writer or the like, and control is possible with substantially the same control signals as in the prior art, which leads to various advantages. For example, it is possible to use a conventional external device without having to effect any modification thereof, which means the present invention can be easily put into practical use.

What is claimed is:

1. A semiconductor data storage device detachably connectable to an external device and supplied with power by the external device, the external device supplying control signals including a card enable signal, an output enable signal, and a write enable signal to said semiconductor data storage device for controlling said semiconductor data storage device to store data, the semiconductor data storage device comprising:

data storage means including non-volatile semiconductor data storage elements and volatile semiconductor data storage elements for storing data and for supplying the stored data, the non-volatile and volatile data storage elements including addresses at which respective data are stored;

a data bus that supplies data to said data storage means and that retrieves data from said data storage means;

read/write and activation signal means generating read/write signals for controlling said data storage means to store data and to supply data, said read/write and activation signal means being responsive to the control signals supplied by the external device;

address means for selecting addresses of said data storage elements, said address means receiving at least one control signal from the external device and said address means being coupled to said non-volatile and volatile semiconductor data storage elements;

an internal power source for maintaining storage of data stored in said data storage means when no power is supplied to said data storage means by the external device;

power control means for detecting whether power is being supplied to said semiconductor data storage device by the external device and for switching between power supplied to said semiconductor data storage device from the external device and said internal power source so that when the external device is connected to said semiconductor data storage device, power is supplied from the external device to said semiconductor data storage device and when the external device is disconnected from said semiconductor data storage device, power is supplied from said internal power source, and for generating a first reset signal upon connection and upon disconnection of the external device and said semiconductor data storage device;

forced control means connected to said power control means and receiving the reset signal for forcibly placing the volatile and non-volatile semiconductor data Storage elements in an inactive state for a predetermined period of time responsive to the reset signal of said power control means;

means connected to said read/write and activation signal means for bringing the read/write signals generated by said read/write and activation signal means to a high-impedance state said means including a plurality of pull-up resistors, the plurality of pull-up resistors determining levels of the read/write signals.

2. The semiconductor data storage device according to claim 1:

wherein said read/write and activation signal means includes a card enable signal line for receiving the card enable signal from the external device, an output enable signal line and write enable signal lines for transmitting the output enable and write enable signals, respectively, from the external device for controlling reading of data from and writing of data into said data storage means, and an address decoder including memory chip enable signal lines, the address decoder being activated and deactivated by the card enable signal for generating memory chip enable signals for activating and deactivating said data storage means;

wherein said means for bringing said read/write signal means into the high-impedance state includes a plurality of tri-state buffers respectively connected to said output enable signal line, said write enable signal lines, and said memory chip enable signal lines, each tri-state buffer having an inactive state producing a high-impedance output;

wherein said forced control means is coupled to said means for bringing, and said forced control means comprises a delay circuit for producing an output signal for deactivating said tri-state buffers when the external device is disconnected from said semiconductor data storage device to produce a high-impedance output after lapse of the predetermined period of time, the predetermined period of time being long enough for each of the read/write signals generated by said read/write and activation signal means to be retained at a predetermined value by said pull-up resistors and, upon connection of the external device to said semiconductor data storage device, for activating said tri-state buffers in response to the reset signal after lapse of the predetermined period of time, the predetermined period of time being long enough for the control signals from the external device on said card enable signal line, said output enable signal line, and said write enable signal lines to attain predetermined values, and delaying generation of the reset signal by a predetermined time; and wherein said forced control means further includes (a) a plurality of OR gates receiving the reset signal and the output signal of the delay circuit for deactivating said card enable signal line, said output enable signal line, and said write enable signal lines upon disconnection of said semiconductor data storage device from the external device and delaying input of control signals from the external device on said card enable signal line, said output enable signal line, and said write enable signal lines upon connection of said semiconductor data storage device to the external device, and (b) an AND gate receiving the reset signal and the output signal of the delay circuit for delaying deactivation of said tri-state buffers upon disconnection of said semiconductor data storage device from the external device and for activating said tri-state buffers upon connection of said semiconductor data storage device to the external device.

3. The semiconductor data storage device according to claim 1:

wherein said read/write and activation signal means includes a card enable signal line for receiving the card enable signal from the external device, an output enable signal line and write enable signal lines for transmitting the output enable and write enable signals from the external device, respectively, for controlling reading of data from and writing of data into said semiconductor data storage means, and an address decoder including memory chip enable signal lines activated and deactivated by the card enable signal for generating memory chip enable signals for activating and deactivating said data storage means wherein said means for bringing said read/write and activation signal means into the high-impedance state includes a plurality of tri-state buffers respectively connected to said output enable signal line, said write enable signal lines, and said memory chip enable signal lines, each tri-state buffer having an inactive state producing a high-impedance output;

wherein said forced control means comprises (a) an edge pulse generator for generating pulses at an interval corresponding to the predetermined period of time in response to a rise and fall of the reset signal, and (b) an inactive signal generating circuit connected to said output enable signal line, said write enable signal line, the edge pulse generator, and said memory chip enable signal lines to deactivate said data storage means for the predetermined period of time in response to a pulse generated by said edge pulse generator, the predetermined period of time being long enough for each of the read/write signals generated by said read/write and activation signal means to be retained at a predetermined value by said pull-up resistors upon disconnection of said semiconductor data storage device from the external device and for said card enable signal line, said output enable signal line, and said write enable signal lines to attain a predetermined value upon connection of said semiconductor data storage device to the external device.

4. A semiconductor data storage device according to claim 1 wherein said means for bringing the read/write and activation signals to a high-impedance state includes a signal line connected to said power control circuit the signal line carrying the reset signal of said power control means, said means for bringing the read/write and activation signals to a high impedance state being responsive to the reset signal.

5. A semiconductor data storage device according to claim 1 wherein said means for bringing the read/write and activation signals to a high impedance state includes a signal line connected to said forced control means wherein said forced control means generates an output signal that is carried by the signal line, said means for bringing the read/write and activation signals to a high impedance state being responsive to the output signal.

6. A semiconductor data storage device detachably connectable to an external device and supplied with power by the external device, the external device supplying control signals to said semiconductor data storage device to store data, said semiconductor data storage device comprising:

data storage means including non-volatile semiconductor data storage elements and volatile semiconductor data storage elements for storing data and for supplying the stored data;

an internal power source for maintaining storage of data stored in the volatile semiconductor data storage elements when no power is supplied to said data storage means by the external device;

power control means for detecting whether power is supplied to said semiconductor data storage device by the external device and for switching between power supplied to said semiconductor data storage device from the external device and said internal power source so that when the external device is connected to said semiconductor data storage device, power is supplied from the external device to said semiconductor data storage device and when the external device is disconnected from said semiconductor data storage device, power is supplied from said internal power source, and for generating a first reset signal upon disconnection of the external device and said semiconductor data storage device; and forced control means connected to said power control means and receiving the reset signal for forcibly deactivating all of the control signals for a predetermined period of time responsive to the reset signal of said power control means, said forced control means including a timing circuit having an output signal wherein the predetermined time period includes a period measured from a time that the external device is disconnected to a time when the output signal reaches a predetermined level.

7. The semiconductor data storage device of claim 6 wherein the timing circuit includes a delay circuit.

8. The semiconductor data storage device of claim 6 wherein the timing circuit includes an edge pulse generator.

* * * * *